(12) United States Patent
Zhang

(10) Patent No.: US 12,507,407 B2
(45) Date of Patent: Dec. 23, 2025

(54) FABRICATION METHOD OF THREE-DIMENSIONAL MEMORY DEVICE

(71) Applicant: YANGTZE MEMORY TECHNOLOGIES CO., LTD., Wuhan (CN)

(72) Inventor: Kun Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 541 days.

(21) Appl. No.: 17/977,161

(22) Filed: Oct. 31, 2022

(65) Prior Publication Data

US 2023/0064048 A1 Mar. 2, 2023

Related U.S. Application Data

(63) Continuation of application No. PCT/CN2021/115695, filed on Aug. 31, 2021.

(51) Int. Cl.
*H10B 43/20* (2023.01)
*H10B 43/35* (2023.01)
*H10B 43/40* (2023.01)

(52) U.S. Cl.
CPC ........... *H10B 43/20* (2023.02); *H10B 43/35* (2023.02); *H10B 43/40* (2023.02)

(58) Field of Classification Search
CPC ........ H10B 43/20; H10B 43/35; H10B 43/40; H10B 43/50
See application file for complete search history.

(56) References Cited

U.S. PATENT DOCUMENTS

| 2019/0019808 A1* | 1/2019 | Choi | H10D 64/62 |
| 2020/0119031 A1* | 4/2020 | Shen | H10B 41/35 |

FOREIGN PATENT DOCUMENTS

| CN | 111211128 A | | 5/2020 | |
| CN | 112838097 A | * | 5/2021 | H10B 43/27 |
| CN | 112885842 A | | 6/2021 | |
| CN | 112951841 A | | 6/2021 | |
| CN | 113257831 A | | 8/2021 | |

* cited by examiner

*Primary Examiner* — Khaja Ahmad
*Assistant Examiner* — Khatib A Rahman
(74) *Attorney, Agent, or Firm* — BAYES PLLC

(57) ABSTRACT

A method of fabricating a three-dimensional (3D) memory device includes forming a stack structure on a substrate, forming a channel structure, a dummy channel structure, and a gate line slit structure penetrating through the stack structure and extending into the substrate, removing the substrate to expose a first side of the stack structure, forming a protective layer covering an exposed portion of the channel structure on the first side of the stack structure, removing at least the exposed portion of the channel structure, and removing the protective layer after removing at least the exposed portion of the channel structure.

17 Claims, 9 Drawing Sheets

FABRICATION METHOD OF THREE-DIMENSIONAL MEMORY DEVICE

CROSS-REFERENCE TO RELATED APPLICATIONS

This application is a continuation of International Application No. PCT/CN2021/115695, filed on Aug. 31, 2021, which is incorporated by reference herein in its entirety.

TECHNICAL FIELD

The present application relates to the field of semiconductor technology, and more particularly to the fabrication method of a three-dimensional memory device.

BACKGROUND

In order to increase memory capacity per unit area, three-dimensional (3D) NAND memory that scales up vertically emerge as needed. However, with the increasing of the number of stack of layers, fabrication processes, such as formation of staircase structure, etching of channel hole and etching of gate line slit, for the three-dimensional memory will face more challenges, especially during the process of forming the circuit pathway between the channel layer and the substrate.

SUMMARY

The present application provides a fabrication method of a three-dimensional memory, the method including: forming a stack structure on a substrate; forming a channel structure, a dummy channel structure and a gate line slit structure penetrating through the stack structure and extending into the substrate, wherein the channel structure includes a channel layer and a functional layer; removing the substrate to expose a first side of the stack structure; forming a protective layer exposing the channel structure on the first side of the stack structure; and removing the protective layer after at least a portion of the functional layer in the exposed portion of the channel structure has been removed.

In some implementations, before removing at least the portion of the functional layer in the exposed portion of the channel structure, the protective layer may cover the dummy channel structure.

In some implementations, before removing at least the portion of the functional layer in the exposed portion of the channel structure, the protective layer may cover the gate line slit structure.

In some implementations, before removing at least the portion of the functional layer in the exposed portion of the channel structure, the protective layer may cover the dummy channel structure and the gate line slit structure.

In some implementations, the gate line slit structure includes a conductive layer and an insulating layer, the insulating layer including a first portion over a side wall of the conductive layer and a second portion between the conductive layer and the substrate, wherein the step of removing at least the portion of the functional layer in the exposed portion of the channel structure may include removing a part of the second portion of the insulating layer while removing at least the portion of the functional layer in the exposed portion of the channel structure.

In some other implementations, the gate line slit structure includes a conductive layer and an insulating layer, the insulating layer including a first portion over a side wall of the conductive layer and a second portion between the conductive layer and the substrate, wherein the step of removing at least the portion of the functional layer in the exposed portion of the channel structure may include removing the second portion of the insulating layer while removing at least the portion of the functional layer in the exposed portion of the channel structure.

In some implementations, the step of forming the channel structure, the dummy channel structure and the gate line slit structure penetrating through the stack structure and extending into the substrate may further include forming a high dielectric constant layer at least partially over an outer sidewall of the gate line slit structure.

In some implementations, the functional layer includes a charge barrier layer, a charge trapping layer and a tunneling layer, wherein the step of removing the protective layer after at least the portion of the functional layer in the exposed portion of the channel structure has been removed may include removing the protective layer after the charge barrier layer and the charge trapping layer in the exposed portion of the channel structure has been removed.

In some implementations, the fabrication method may further include removing the tunneling layer in the exposed portion of channel structure to expose the channel layer after the protective layer has been removed.

In some implementations, the functional layer includes a charge barrier layer, a charge trapping layer and a tunneling layer, wherein the step of removing the protective layer after at least the portion of the functional layer in the exposed portion of the channel structure has been removed may include removing the protective layer after removing the charge barrier layer, the charge trapping layer and the tunneling layer in the exposed portion of the channel structure to expose the channel layer.

In some implementations, the fabrication method may further include forming a semiconductor layer in contact with the exposed channel layer on the first side.

In some implementations, the protective layer may include a layer of photoresist.

In accordance some implementations of the present application, by forming a protective layer covering either the dummy channel structure or the gate line slit structure after removing the substrate, the tendency to enlarge the seams or voids in the dummy channel structure and/or the gate line slit structure (or on both sides of the gate line slit structure) by etching materials during the process of removing at least portion of the functional layer can be prohibited, such that the risk of short circuit leakage among gate conductive layers, which may occur during the process of forming semiconductor layers because of the semiconductor material that could be filled into the seams or voids, can be lowered, so as to help to improve the reliability of the fabricated three-dimensional memory.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

The present disclosure will be described with reference to the accompanying drawings.

DETAILED DESCRIPTION

For better understanding of the present application, various aspects of the present application will be described in more detail with reference to accompanying drawings. It is to be appreciated that the detailed description is only for the purpose of explaining example implementations of the present application and will in no way limit the scope of the present application.

Terms used herein are for the purpose of describing particular example implementations, but not intended to place any limitation. As used in this specification, terms "include", "comprise", "have" and/or "contain" indicate existence of the stated features, integrals, elements, components and/or combinations thereof, but will not exclude existence of one or more other features, integrals, elements, components and/or any combination thereof.

Description will be made herein with reference to schematic diagrams of example implementations. Example implementations disclosed herein should not be interpreted to be limited to specific shapes and dimensions and instead may include various equivalent structures with identical functions and variations in shape and size caused by, for example, manufacture. Positions shown in the figures are schematic in nature and not intended to place any limitation on positions of various components.

All the terms (including technical and scientific terms) used herein have the same meanings as those commonly understood by persons of ordinary skills in the art, unless otherwise specified. Terms such as those defined in common dictionaries should be interpreted to have the meanings consistent with their contexts in related fields, and should not be interpreted too ideally or formally unless specified as such expressly.

As used herein, the term "layer" refers to a material portion of a region with a thickness. A layer has a top side and a bottom side, wherein the bottom side of the layer is relatively proximate to the substrate and the top side is relatively remote from the substrate. A layer can extend over the entirety of an underlying or overlying structure or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically and/or along a tapered surface. A substrate can be a layer, can include one or more layers therein, and/or can have one or more layer thereupon, thereabove, and/or therebelow. A layer can include multiple layers.

Figure 1:
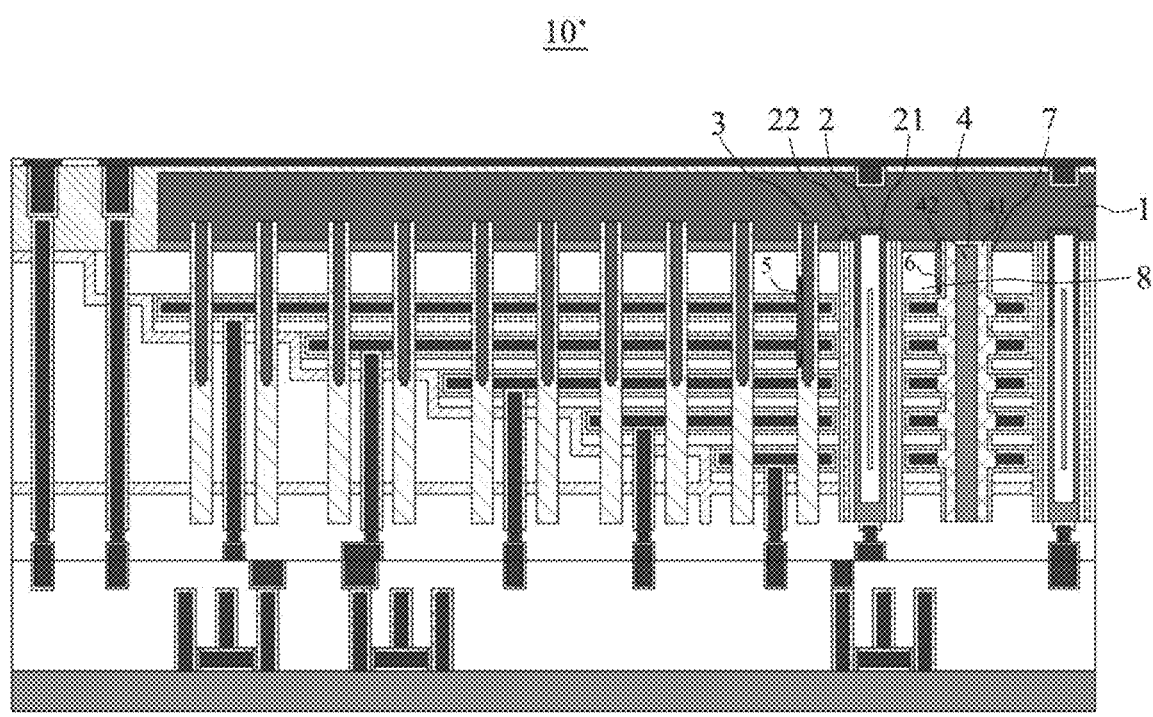
FIG. 1 is a cross-sectional diagram of a three-dimensional memory device in accordance with implementations of the present application.

FIG. 1 is a cross-sectional diagram of a three-dimensional memory device 10' according to some implementations of the present disclosure. As shown in FIG. 1, a semiconductor layer 1 covers channel structure 2, dummy channel structure 3 and a gate line slit structure 4, and is used to achieve contact and electrical connection with the channel layers 21 in the channel structures 2. In some implementations, the three-dimensional memory device 10' further includes a high dielectric constant layer 7. In some implementations, the semiconductor layer 1 may be formed, for example, by a thin film deposition process after removing the substrate (not shown) and the portion of the functional layer 22 (not shown) extending into the substrate.

During the process of removing the above-mentioned structures (e.g., during the process of removing the portion of the functional layer 22 extending into the substrate), etching materials (e.g., etching gas) may enlarge the seams or voids (such as a seam or void 5), for example, at the ends of the dummy channel structure 3. It is noted that the inner structure of the dummy channel structure 3 (e.g., including a seam or void) shown in FIG. 1 is only an example and it should not be understood that all dummy channel structures 3 have the inner structure as shown in FIG. 1. There is a weak adhesion strength between the high dielectric constant layer 7 and the dielectric material on either side of it (such as the dielectric layer 8 in the stack structure and the insulating layer 41 in the gate line slit structure 4) because of their difference in material properties. There is a weak adhesion strength between the insulating layer 41 and the conductive layer 42 because of their difference in material properties. Also, during the process of removing the above-mentioned structures (e.g., during the process of removing the portion of the functional layer 22 extending into the substrate), etching materials (e.g. etching gas) may etch along the interface between the high dielectric constant layer 7 and the dielectric material on either side of it and/or the interface between the insulating layer 41 and the conductive layer 42, resulting in seams or voids, for example, the seam or void 6 near the interface between the high dielectric constant layer 7 and the dielectric layer 8 in the stack structure.

During the process of forming the semiconductor layer 1, the semiconductor material may fill into the seams or voids, which may cause, for example, short circuit leakage between adjacent word lines or between the semiconductor layer 1 and word lines and in turn affect the performance and yield of the three-dimensional memory device 10'. Therefore, how to address the above-mentioned technical problems in the fabrication processes of three-dimensional memories is one of challenges.

Figure 2:
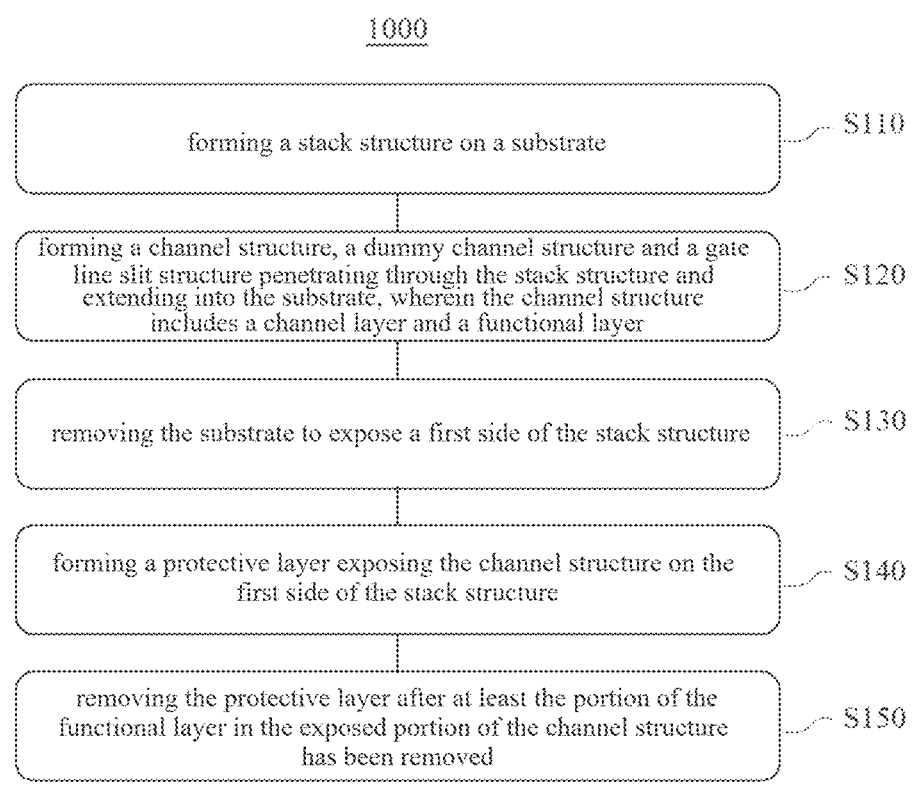
FIG. 2 is a flowchart illustrating a method of fabricating a three-dimensional memory device in accordance with implementations of the present application.

Some implementations of the present application provide a method 1000 of fabricating a three-dimensional memory device. As shown in FIG. 2, initially, the method 1000 of fabricating a three-dimensional memory device in accordance some implementations of the present application starts from step S110, in which a stack structure is formed on a substrate. The material of the substrate may include, for example, silicon (such as single crystal silicon and polysilicon), silicon germanium (SiGe), germanium (Ge), silicon on insulator (SOI), germanium on insulator (GOI), gallium arsenide (GaAs), gallium nitride (GaN), silicon carbide (SiC), glass, group III-V compound semiconductor or any combinations thereof. Subsequently, in step S120, the channel structure, the dummy channel structure and the gate line slit structure are formed penetrating through the stack structure and extending into the substrate, wherein the channel structure includes a channel layer and a functional layer. In step S130, the substrate is removed to expose a first side of the stack structure, and in step S140, a protective layer exposing the channel structure is formed on the first side of the stack structure. That is to say, the protective layer may cover at least one of the dummy channel structure and the gate line slit structure, but not the channel structure. In step S150, at least the portion of the functional layer in the exposed portion of the channel structure is removed and then the protective layer is removed.

It is to be understood that the steps shown in the method 1000 are not exclusive and other steps may be performed before, after or between any one(s) of the shown steps. In addition, some of the shown steps may be performed simultaneously or in an order different from the one shown in FIG. 2.

FIGS. 3-13 are cross-sectional diagrams illustrating the method 1000 of fabricating a three-dimensional memory device in accordance with implementations of the present application. The steps S110-S150 described above will be more detailed hereafter in connection with FIGS. 3-13.

S110: forming a stack structure on a substrate.

Figure 3:
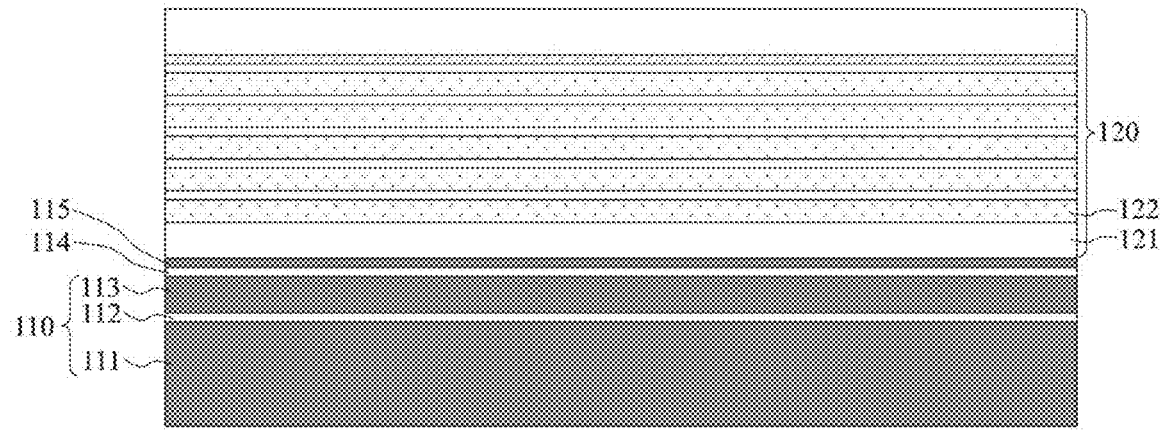
FIGS. 3-13 are cross-sectional diagrams illustrating the method of fabricating a three-dimensional memory in accordance with implementations of the present application.

In some implementations of step S110, as shown in FIG. 3, the substrate 110 may include a base 111 as well as a stop layer 112 and a first sacrificial layer 113 disposed on the base 111 in this order. In some implementations, compared with the stop layer 112 and the first sacrificial layer 113, the base 111 may have a thickness which is relatively thick. The processes of forming the stop layer 112 and the first sacrificial layer 113 may include, but not limited to, chemical vapor deposition (CVD), physical vapor deposition (PVD), atomic layer deposition (ALD), sputtering, thermal oxidation or any combinations thereof. In some implementations, the material of the base 111 may include, for example, silicon, and the material of the stop layer 112 may include, for example, silicon oxide, and the material of the first sacrificial layer 113 may include, for example, polysilicon.

In this step, a stack structure 120 may be formed on the substrate 110. The stack structure 120 may include a plurality of alternating dielectric layers 121 and second sacrificial layers (e.g., gate sacrificial layers 122) stacked in the direction perpendicular to or approximately perpendicular to the substrate 110. In some implementations, the processes of forming the stack structure 120 may include the thin film deposition process such as CVD, PVD, ALD or any combinations thereof. The number of the layers in which the dielectric layers 121 and the gate sacrificial layers 122 are stacked in the stack structure 120 may be, for example, 8, 32, 64, 128, etc. The more the number of stacked layers in the stack structure 120 is, the higher the integration level is and the more the number of memory cells formed by it is. The number of stacked layers and the height of the stack structure 120 may be configured based on actual memory demands and will be subject to no limitation in the present application.

In some implementations, the gate sacrificial layers 122 may be removed to form sacrificial gaps and conductive materials are filled into the sacrificial gaps (i.e., the space that was occupied by the gate sacrificial layers 122) to form conductive layers, e.g., gate conductive layers, i.e., word lines. During the process of removing the gate sacrificial layers 122, the dielectric layers 121 and the gate sacrificial layers 122 may be different in etch selectivity ratio. In some implementations, the material of the dielectric layers 121 may include, for example, silicon oxide, and the material of the gate sacrificial layer 122 may include, for example, silicon nitride.

It is to be understood that, although the gate conductive layers are formed by replacing the gate sacrificial layers with conductive filling materials in the implementation of the present application, the implementation in which the gate conductive layers can be formed is not limited to this in the present application, for example, it can also be achieved by, for example, directly stacking the dielectric layers and the gate conductive layers alternately.

In some implementations, before the formation of the stack structure 120, a silicon oxide layer 114 and a polysilicon layer 115 may be sequentially formed on the first sacrificial layer 113 of the substrate (e.g., the substrate 110) by the thin film deposition process such as CVD, PVD, ALD or any combinations thereof, so that the silicon oxide layer 114 and the polysilicon layer 115 are formed between the substrate 110 and the stack structure 120. In some implementations, the stack structure 120 may be formed directly on the substrate 110, so that there is no the silicon oxide layer 114 and the polysilicon layer 115 between the substrate 110 and the stack structure 120, but the present application is not limited in this aspect.

In some implementations, as described hereafter, the substrate 110 may be used to provide mechanical support for the channel structure, the dummy channel structure, the gate line slit structure and the like formed thereon, and will be removed in a later process.

S120: forming the channel structure, the dummy channel structure and the gate line slit structure penetrating through the stack structure and extending into the substrate, wherein the channel structure includes a channel layer and a functional layer.

Figure 4:
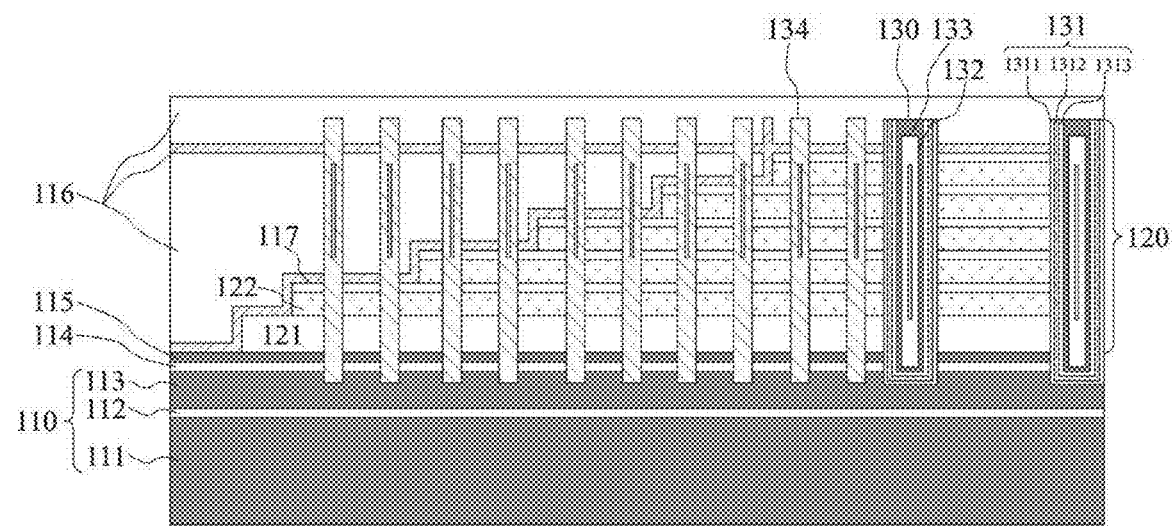

In step S120, as shown in FIG. 4, the channel structure 130 penetrates through the stack structure 120 including, for example, alternately stacked dielectric layers 121 and gate sacrificial layers 122, and extends into the first sacrificial layer 113 of the substrate 110 in a direction toward the substrate 110 (e.g., in the direction perpendicular to the substrate 110). In some implementations, the channel structure 130 may have an approximate contour of, for example, cylinder, truncated cone or prism and may have an outer wall which includes a functional layer 131 and a channel layer 132 disposed in this order from outside to inside. In some implementations, the functional layer 131 may include a charge barrier layer 1311, a charge trapping layer 1312 and a tunneling layer 1313 disposed in this order from outside to inside. The material of the charge barrier layer 1311, the charge trapping layer 1312 and the tunneling layer 1313 may include, for example, silicon oxide, silicon nitride and silicon oxide respectively, to form the functional layer 131 with an ONO structure. The material of the channel layer 132 may include a semiconductor material, for example, silicon, such as amorphous silicon, polysilicon or single crystalline silicon. In some implementations, a plurality of channel structures 130 may be arranged in a two-dimensional array in a plane parallel to the substrate 110.

In some implementations, the channel structure 130 may be formed by a photolithography and etching processes (e.g., a dry or wet etching process) and the thin film deposition process. In some implementations, channel holes may first be formed to penetrate through the stack structure 120 and extend into the first sacrificial layer 113 by the photolithography and etching processes. Further, the functional layer 131 (including the charge barrier layer 1311, the charge trapping layer 1312 and the tunneling layer 1313) and the channel layer 132 may be formed sequentially on the inner wall of the channel hole by the thin film deposition process such as CVD, PVD, ALD or any combinations thereof. In some implementations, a dielectric material (e.g., silicon oxide) may be filled into the channel hole (having the functional layer 131 and the channel layer 132 formed therein) by the thin film deposition process such as CVD, PVD, ALD or any combination thereof.

In some implementations, the channel structure 130 further may have a channel plug 133 at its end away from the substrate 110. The channel plug 133 may be made of, for example, the same semiconductor material as the channel layer 132 and in contact with the channel layer 132. The channel plug 133 may function as, for example, the drain of the channel structure 130. It is to be understood that the portions of the functional layer 131 and the channel layer 132 in the channel structure 130 corresponding to each gate sacrificial layer 122 (i.e., a gate conductive layer formed subsequently) in the stack structure 120 form a memory cell together with the gate sacrificial layer 122. In some implementations, a gate conductive layer may correspond to the control terminal for a memory cell. In some implementations, the plurality of memory cells in a channel structure 130 are arranged in series in the direction generally perpendicular to the substrate 110 and share the channel layer 132. The memory cell in the channel structure 130 is controlled by the voltage of the gate conductive layer, so that the carriers in the channel layer 132 enter the charge trapping layer 1312 of the functional layer 131, or the carriers in the charge trapping layer 1312 of the functional layer 131 retreat to the channel layer 132, so as to enable the memory cell to be in a programmed state or an erased state (unprogrammed state). In some implementations, among the plurality of memory cells arranged in series in the direction generally perpendicular to the substrate 110, the memory cells at either end may be used as select transistors to control the plurality of memory cells arranged in series to turn on or off. In some implementations, each of the select transistors may be referred to as a top select transistor or a bottom select transistor depending on its position. In some implementations, a top select transistor may be disposed near the channel plug 133.

In some implementations, a staircase structure 117 may be formed at the edge of the stack structure 120, and may be formed by performing multiple trim-etch cycles process on the plurality of alternately stacked dielectric layers 121 and gate sacrificial layers 122. In some implementations, in the direction perpendicular to the substrate 110, a pair of dielectric layer 121 and gate sacrificial layer 122 away from the substrate 110 partially covers the adjacent pair of dielectric layer 121 and gate sacrificial layer 122 closer to the substrate 110, so that the gate sacrificial layer 122 in the pair of dielectric layer 121 and gate sacrificial layer 122 closer to the substrate 110 has a region exposed by the adjacent pair of dielectric layer 121 and gate sacrificial layer 122 away from the substrate 110. The exposed region of the gate sacrificial layer 122 may be used as an electrical connection region for a word line contact to be formed in the subsequent processes. In some implementations, at least one insulating material 116 may be filled on the top of the staircase structure 117, such as silicon oxide, silicon nitride, silicon oxynitride or the like.

In this step, the dummy channel structure 134 penetrates through at least the portion of the stack structure 120 in the region corresponding to the staircase structure 117 and extends into the first sacrificial layer 113 of the substrate 110 in a direction toward the substrate 110 (e.g., in the direction perpendicular to the substrate 110). In some implementations, the dummy channel structure 134 may have a contour and an inner structure similar to those of the channel structure 130 and be formed by a process similar to that for the channel structure 130. In some other implementations, after the formation of dummy channel holes, at least one insulating material may be filled into the dummy channel holes by the thin film deposition process such as CVD, PVD, ALD or any combinations thereof. In some implementations, the dummy channel holes may be filled with, for example, silicon oxide. The dummy channel structures 134 have functions including, but not limited to, mechanical support or load balancing.

Figure 5:
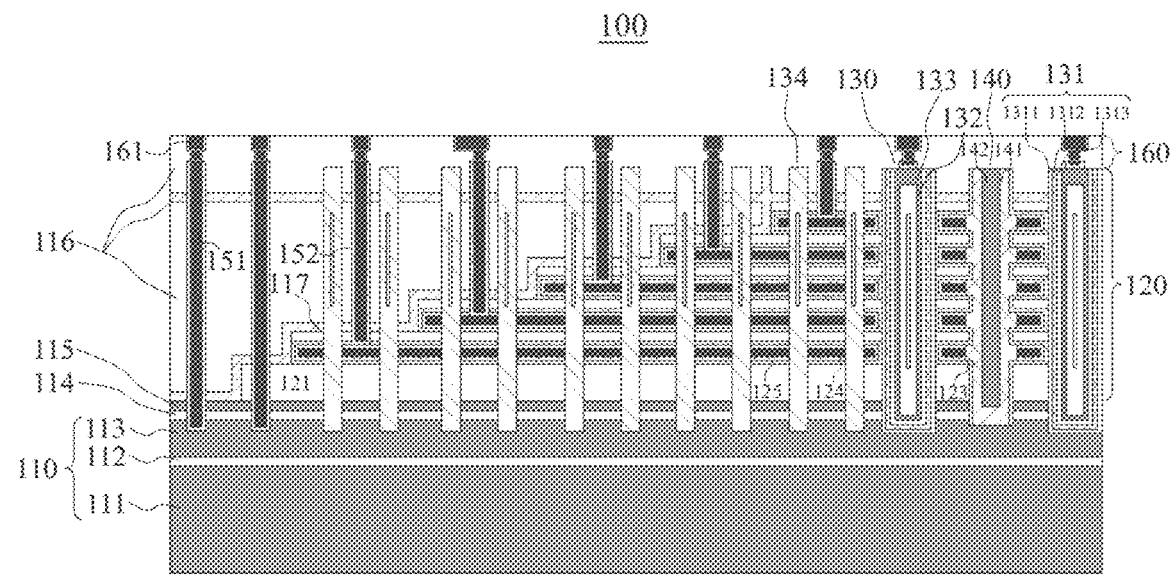

In this step, as shown in FIG. 5, the gate line slit structure 140 penetrates through the stack structure 120 and extends into the first sacrificial layer 113 of the substrate 110 in a direction toward the substrate 110 (e.g., in the direction perpendicular to the substrate 110). In some implementations, the gate line slit structure 140 may extend in the direction parallel to the substrate 110, i.e., in the direction perpendicular to FIG. 5.

In some implementations, the process of forming the gate line slit structure 140 may include the steps of forming a gate line slit and replacing the gate sacrificial layers in the stack structure with gate conductive layers through the gate line slit. In some implementations, the gate line slit may be formed to penetrate through the stack structure 120 and extend into the first sacrificial layer 113 by the photolithography and etching processes (e.g., a dry or wet etching process). Further, the gate sacrificial layers 122 in the stack structure 120 may be removed through the gate line slit to form sacrificial gaps. In some implementations, a high dielectric constant layer 123 may be formed over the inner wall of the sacrificial gap and the gate line slit using the thin film deposition process such as CVD, PVD, ALD or any combination thereof. In some implementations, using the thin film deposition process such as CVD, PVD, ALD or any combinations thereof, adhesive layer 124 may be formed over the portion of the high dielectric constant layer 123 in the sacrificial gap, and the conductive layer (e.g., gate conductive layer 125) may be formed in the sacrificial gap with the high dielectric constant layer 123 and the adhesive layer 124 formed therein. In some implementations, the material of the gate conductive layer 125 may include, for example, conductive material such as tungsten, cobalt, copper, aluminum or any combination thereof. The material of the adhesive layer 124 may include, for example, titanium, titanium nitride, tantalum, tantalum nitride or any combination thereof and be used to stick the gate conductive layer 125 and the high dielectric constant layer 123 together and prevent the conductive material of the gate conductive layer 125 from diffusing. The material of the high dielectric constant layer 123 may include, for example, aluminum oxide, hafnium oxide or any combination thereof. After the above-described process treatments, the high dielectric constant layer 123 may cover at least the portion of the inner wall of the gate line slit.

In some implementations, the method of forming the gate line slit structure 140 may also include the following steps. In some implementations, the portion of the high dielectric constant layer 123 at the bottom of the gate line slit may be removed by the photolithography and etching processes (e.g., the dry or wet etching process). In some implementations, the insulating layer 141 and the conductive layer 142 may be formed sequentially in the gate line slit by the thin film deposition process such as CVD, PVD, ALD or any combinations thereof, so that the gate line slit structure 140 is formed. The material of the insulating layer 141 may include dielectric material such as silicon oxide, silicon nitride, silicon oxynitride or the like. The material of the conductive layer 142 may include conductive material such as tungsten, cobalt, copper, aluminum, doped polysilicon or the like. It is to be noted that the insulating layer 141 may include a first portion over the sidewall of the conductive layer 142 and a second portion between the conductive layer 142 and the substrate 110. In some implementations, the first portion and the second portion of the insulating layer 141 may have the same thickness or different thicknesses, and there is no limitation in this aspect for this implementation. After the above-described process treatments, the high dielectric constant layer 123 may be over at least portions of the outer wall of the gate line slit structure 140, such as those portions corresponding to dielectric layer 121 in the stack structure 120, the silicon oxide layer 114, the polysilicon layer 115 and at least a part of the first sacrificial layer 113 of the substrate 110 respectively. In some implementations, an insulating material 116 may also be filled over the top layer of the substrate 110, for example, to cover the surface of the polysilicon layer 115. In some implementations, the insulating material 116 may directly cover the surface of the substrate 110 (e.g., the surface of the first sacrificial layer 113). In some implementations, a conductive contact 151 may extend from the surface of the insulating material 116 away from the substrate 110 into the first sacrificial layer 113 of the substrate 110 in a direction toward the substrate 110 (e.g., in the direction perpendicular to the substrate 110). In some implementations, the plurality of conductive contacts 151 may be used to transfer electrical signals between a first semiconductor structure 100 and a second semiconductor structure 200 (see FIG. 6) and enable interactions between the electrical signals of these two semiconductor structures and external control signals after these two semiconductor structures are bonded together. In some implementations, the material of the conductive contact 151 may include the conductive material such as tungsten, cobalt, copper, aluminum, doped polysilicon or the like.

In some implementations, a plurality of word line contacts 152 may extend to the electrical connection regions of a plurality of gate conductive layers 125 in a direction intersecting the gate conductive layers 125 (e.g., in the direction perpendicular to or approximately perpendicular to the gate conductive layers 125), so that one end of the word line contact 152 is electrically connected with the gate conductive layer 125. The word line contact 152 may be formed by, for example, the photolithography and etching processes and the thin film deposition process, and its material may include, for example, conductive material such as tungsten, cobalt, copper, aluminum or any combination thereof. In some implementations, the conductive contact 151 and the word line contact 152 may have an adhesive layer (or referred to as a metal barrier layer) as its outer wall structure.

In some implementations, a first interconnect layer 160 may be formed on the top side of the stack structure 120 and used to transfer electrical signals to and from the second semiconductor structure 200. In some implementations, the first interconnect layer 160 may include a plurality of interconnect lines (not shown) extending in the direction approximately parallel to the substrate 110 and a plurality of interconnect accesses 161 extending in a direction toward the substrate 110, e.g., in the direction perpendicular to or approximately perpendicular to the substrate 110. In some implementations, the first interconnect layer 160 may include a plurality of interlayer dielectric (ILD) layers, in which the interconnect lines and the interconnect accesses 161 may be formed. In other words, the first interconnect layer 160 may include the interconnect lines and the interconnect accesses 161 in a plurality of interlayer dielectric layers. In some implementations, the material of the interconnect line and the interconnect access 161 may include conductive material such as tungsten, cobalt, copper, aluminum or any combination thereof. The material of the interlayer dielectric layer may include dielectric material such as silicon oxide, silicon nitride, silicon oxynitride, low dielectric constant material or any combination thereof. It is to be noted that the interconnect line and/or the interconnect access 161 in the first interconnect layer 160 may be in electrical connection with the other end of the word line contact 152 and/or the other end of the conductive contact 151, so that the first interconnect layer 160 is electrically connected to gate conductive layers 125 via at least some word line contacts 152 and electrically connected to the second semiconductor structure 200 via at least some conductive contacts 151.

Figure 6:
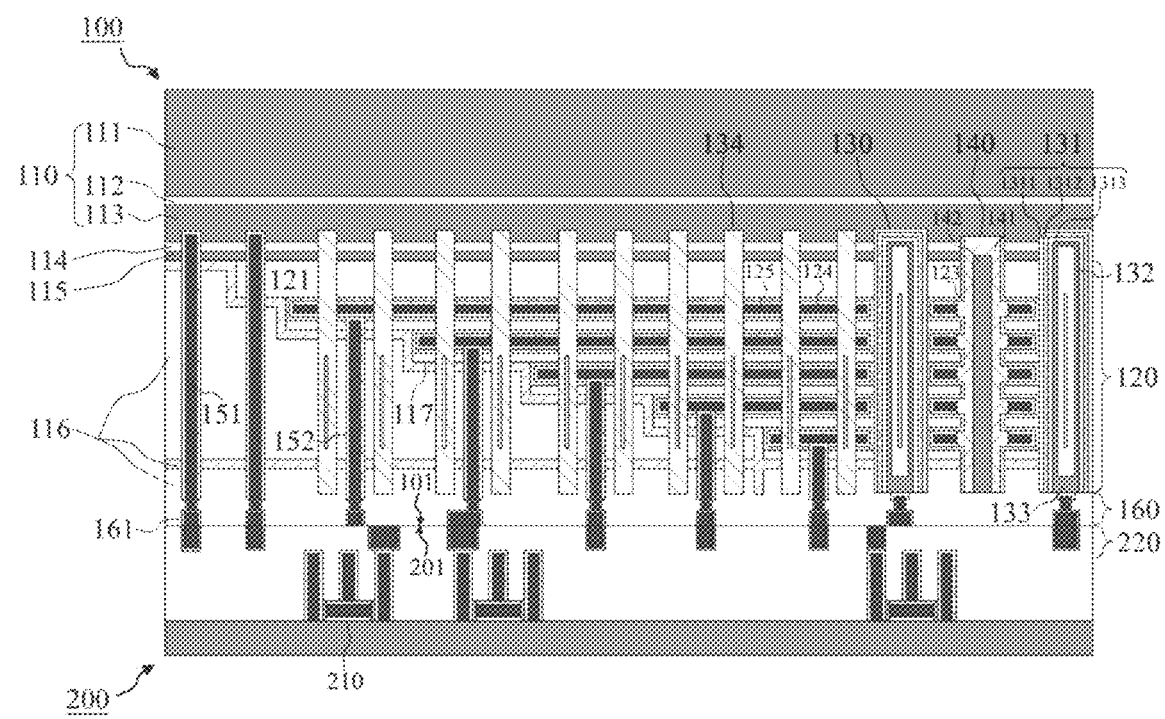

In some implementations, as shown in FIG. 6, the first semiconductor structure 100 after the above-described process treatments and the second semiconductor structure 200 may be joined together through bonding. In some implementations, the second semiconductor structure 200 may be formed concurrently during the process of forming the first semiconductor structure 100, so that the first semiconductor structure 100 and the second semiconductor structure 200 may be processed in parallel, improving the productivity. The second semiconductor structure 200 may include a plurality of peripheral devices 210. In some implementations, the peripheral devices 210 may include, for example, any suitable semiconductor devices such as metal oxide semiconductor field effect transistor (MOSFET), bipolar transistor (BJT), diode, resistor, inductors, capacitor or any combinations thereof. In some implementations, the plurality of peripheral devices 210 may constitute digital, analog, and/or mixed digital-analog circuit module for implementing various functions. In some implementations, the circuit modules may include page buffer, address decoder and sense amplifier.

In some implementations, the second semiconductor structure 200 may include a second interconnect layer 220 used to transfer electrical signals to and from the first semiconductor structure 100. The second interconnect layer 220 may have the structure and fabrication method similar to those of the first interconnect layer, and the related details will not be repeated here.

In some implementations, when the first semiconductor structure 100 and the second semiconductor structure 200 will be joined together through bonding, the first semiconductor structure 100 may have a first bonding face 101 away from the substrate 110. The interconnect lines and/or the interconnect accesses 162 in the first interconnect layer 160 may be exposed at the first bonding face 101 and used as the first bonding contacts of the first semiconductor structure 100. Similarly, the second semiconductor structure 200 may have a second bonding face 201. The interconnect lines and/or the interconnect accesses in the second interconnect layer 220 may be exposed at the second bonding face 201 and used as the second bonding contacts of the second semiconductor structure 200. The first semiconductor structure 100 may be positioned on the second semiconductor structure 200, for example, by aligning the first bonding contacts with the second bonding contacts, so that the first bonding contacts and the second bonding contacts are in electrical connection with each other at the aligned positions and in turn the channel structure 130, conductive contacts 151 or any other suitable structures in the first semiconductor structure 100 are electrically coupled with the peripheral devices 210 in the second semiconductor structure 200.

S130: removing the substrate to expose the first side of the stack structure.

Figure 7:
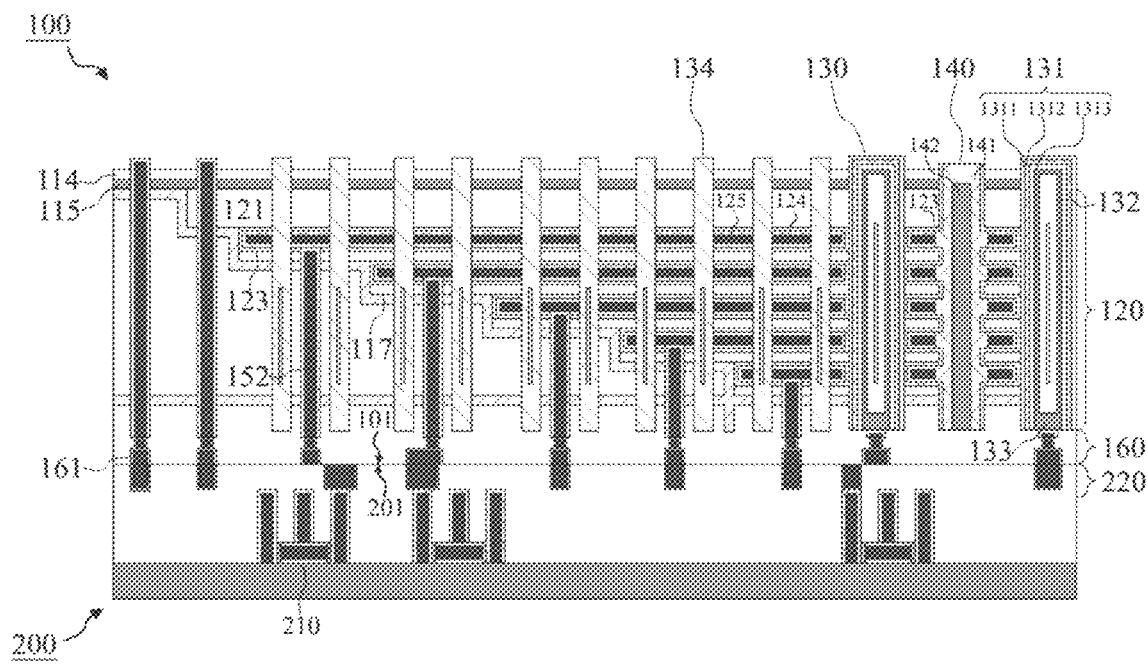

In step S130, as shown in FIG. 7, in some implementations, the base 111, the stop layer 112 and the first sacrificial layer 113 in the substrate 110 may be removed (e.g., in this order) from the side of the substrate 110 without the channel structures 130 formed therein using the photolithography and etching processes (e.g., a dry or wet etching process), a chemical mechanical polishing (CMP) process or any combination thereof, so that the portion of the channel structure 130 that extends into the substrate 110, the portion of the dummy channel structure 134 that extends into the substrate 110, and the portion of the gate line slit structure 140 that extends into the substrate 110 are exposed. In some implementations, during the process of removing the substrate 110, the portion of the conductive contacts 151 extending into the substrate 110 may be exposed. For the channel structure 130, after the above-described process treatments, the portions of the functional layer 131 and the channel layer 132 that extend into the substrate 110 are exposed.

It can be understood that when the substrate 110 includes a base 111 made of silicon, a stop layer 112 made of silicon oxide and a first sacrificial layer 113 made of polysilicon, during the process of removing the base 111, the stop layer 112 and the first sacrificial layer 113 in this order, the stop layer 112 may stop the process of removing the substrate 111 at this layer, facilitating the control of process uniformity for the removing of the base 111. Similarly, the first sacrificial layer 113 may stop the process of removing the stop layer 112 at this layer, facilitating the control of process uniformity for the removing of the stop layer 112.

In some implementations, when a silicon oxide layer 114 is on the surface of the first sacrificial layer 113, the silicon oxide layer 114 may stop the process of removing the first sacrificial layer 113 at this layer, facilitating the control of process uniformity for the removing of the first sacrificial layer 113.

In some other implementations, when the substrate is a single layer structure without the silicon oxide layer 114 formed thereon, the substrate may be removed to expose, for example, the channel structure 130, the dummy channel structure 134, the gate line slit structure 140 and the conductive contacts 151 by controlling process parameters such as etch time, etch rate or the like.

S140: forming a protective layer exposing the channel structure on the first side of the stack structure.

Figure 8A:
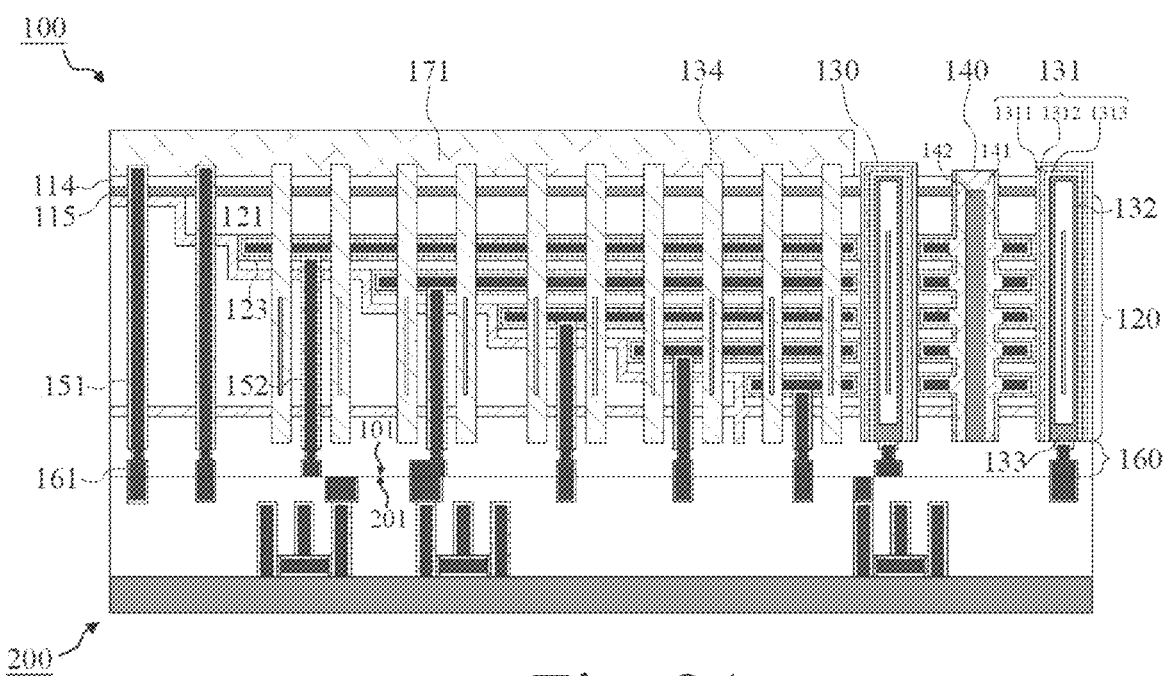
Figure 8B:
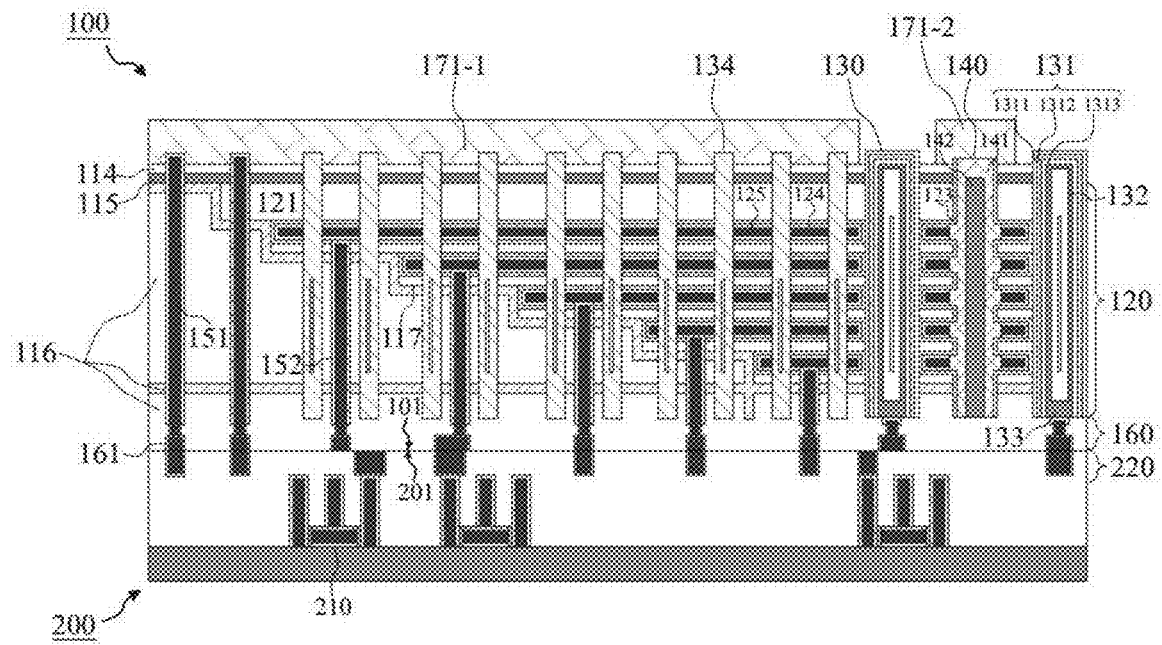
Figure 8C:
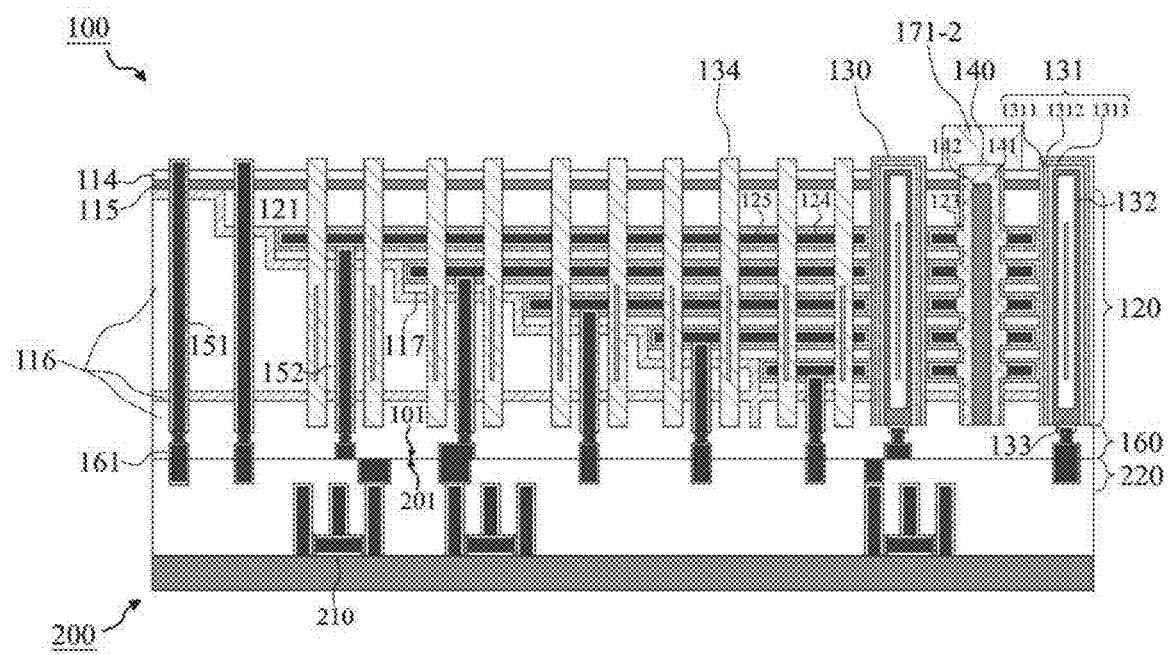

FIGS. 8A-8C are cross-sectional diagrams illustrating the formation of the protective layer in step S140 in accordance with implementations of the present application. In some implementations, as shown in FIG. 8A, a protective layer 171-1 is formed on, for example, the surface of the silicon oxide layer 114 on the first side of the stack structure 120 (i.e., the side away from the second semiconductor structure 200), and in the area corresponding to the dummy channel structures 134. The protective layer 171-1 may cover (e.g., completely) the dummy channel structures 134 (e.g., enclose the exposed portion of the dummy channel structure 134), for example, in the direction perpendicular to or approximately perpendicular to the substrate 110. As noted above, when the above protective layer 171-1 is not provided, during the process of filling insulating material (such as silicon oxide) in the dummy channel hole, the insulating material filled in the dummy channel hole may not be incompact due to process reasons, resulting in seams or voids formed therein. During the subsequent process of removing at least the portion of the functional layer 131 in the exposed portion of the channel structure, etching materials (e.g., etching gases) may enlarge the seams or voids in the dummy channel structure 134. In accordance with the implementation of the present application, before the step of removing at least portion of the functional layer 131, the protective layer 171-1 covering the dummy channel structure 134 is formed to prohibit the tendency to enlarge the seams or voids in the dummy channel structure by the etching materials during the process of removing at least portion of the functional layer 131, facilitating reduction of the risk of short circuit leakage between gate conductive layers (e.g., adjacent gate conductive layers) that may occur during the subsequent process of forming semiconductor layers because of the semiconductor materials that could be filled into the seams or voids.

In some implementations, the protective layer 171-1 may also cover the conductive contact 151, for example, enclose the exposed portion of the conductive contact 151.

In some implementations, the material of the protection layer 171-1 may include photoresist and be formed by, for example, a spinning process. In some implementations, if an etching process is used to remove at least the portion of the functional layer 131 in the exposed portion of the channel structure, for the etching material (e.g., etching gas), the protective layer 171-1 may also be prepared from a material with a higher etch selectivity ratio than the functional layer 131 to be removed, so that the etch rate of the protective layer 171-1 is relatively low (e.g., far lower than that of the functional layers 131), facilitating to reduce (for example, avoid) that the portions of the silicon oxide layer 114 and dielectric layer 121 in contact with the seams in the dummy channel structure 134 is etched along the seams in the dummy channel structures 134, and thus facilitating reduction of the risk of short circuit leakage.

In some implementations, as shown in FIG. 8B, on the surface of, for example, the silicon oxide layer 114 on the first side of the stack structure 120, a protective layer 171-1 may be formed in the area corresponding to the dummy channel structure 134 and a protective layer 171-2 may be formed in the area corresponding to the gate line slit structure 140. The protective layer 171-2 may cover (e.g., completely) the gate line slit structure 140 (e.g., enclose the exposed portion of the gate line slit structure 140), for example, in the direction perpendicular to or approximately perpendicular to the substrate 110. In some implementations, the protective layer 171-2 may have the material and fabrication method identical to those of the protective layer 171-1 and related details will not be repeated here. It is to be noted that, during the process of forming the high dielectric constant layer 123 and the gate line slit structure 140, on the one hand seams or voids may be formed because there is a weak adhesion strength between the high dielectric constant layer 123 and the dielectric material on either side of it (such as the dielectric layer 121 in the stack structure 120 and the insulating layer 141 in the gate line slit structure). On the other hand, seams or voids may be formed because there is a weak adhesion strength between the insulating layer 141 and the conductive layer 142. As noted above, when the protective layer 171-2 is not formed, during the subsequent process of removing at least the portion of the functional layer 131, etching materials (e.g., etching gases) may enlarge the seams or voids in or on either side of the gate line slit structure 140. In accordance with the implementations of the present application, by forming the protective layer 171-1 in the area corresponding to the dummy channel structures 134 and the protective layer 171-2 in the area corresponding to the gate line slit structure 140 on the first side of the stack structure 120, the tendency to enlarge the above-mentioned seams or voids may be prohibited, facilitating reduction of the risk of short circuit leakage between the gate conductive layers (e.g., adjacent gate conductive layers) that may occur during the subsequent process of forming semiconductor layers because of the semiconductor materials that could be filled into the seams or voids.

In some implementations, as shown in FIG. 8C, on the surface of, for example, the silicon oxide layer 114 on the first side of the stack structure 120, the protective layer 171-2 may be formed in the area corresponding to the gate line slit structure 140. In some implementations, the protective layer 171-2 may have the material and fabrication method identical to those of the protective layer 171-1 and related details will not be repeated here. Since seams or voids may form randomly in the dummy channel structures 134, in the gate line slit structure 140, or on either side of the gate line slit structure 140, in accordance with the implementations of the present application, at least during the process of removing at least the portion of the functional layer 131 in the exposed portion of the channel structure, the tendency to enlarge the seams or voids in or on either side of the gate line slit structure 140 by the etching materials can be prohibited.

S150: removing the protective layer after at least the portion of the functional layer in the exposed portion of the channel structure has been removed.

Figure 9A:
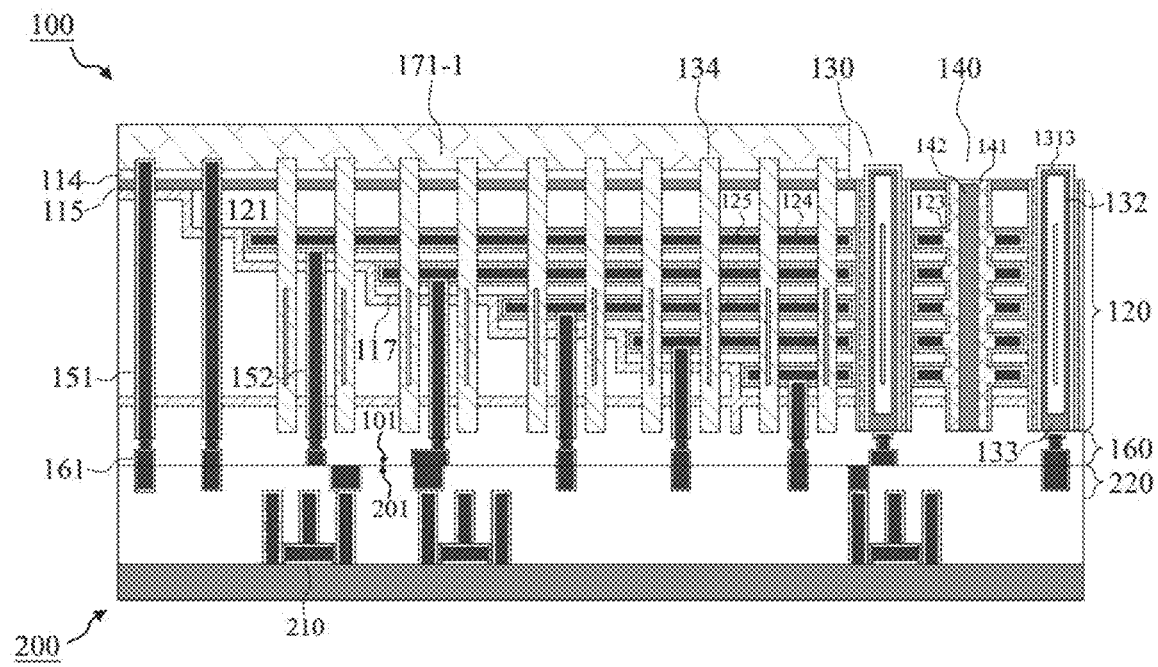
Figure 9B:
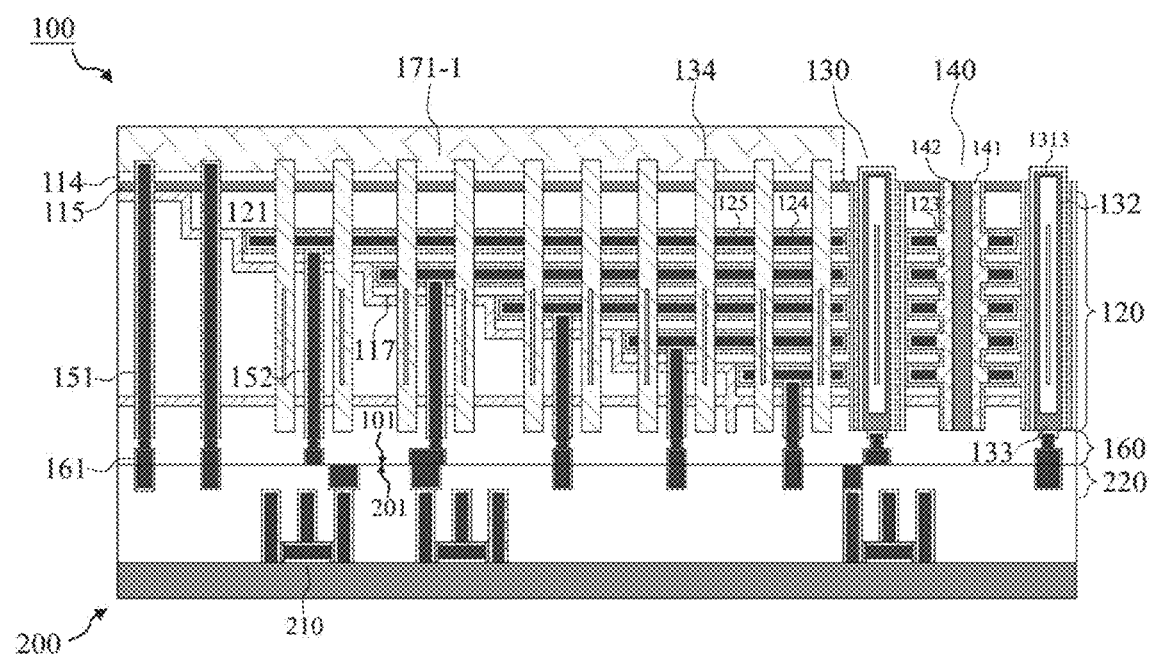
Figure 10:
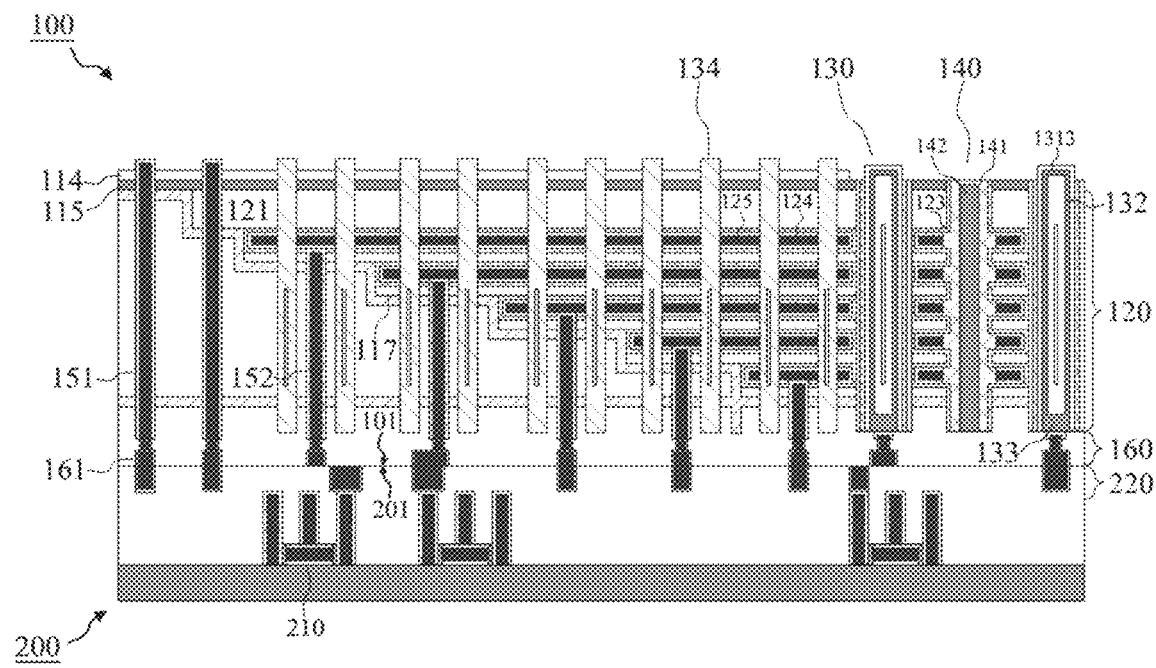
Figure 11:
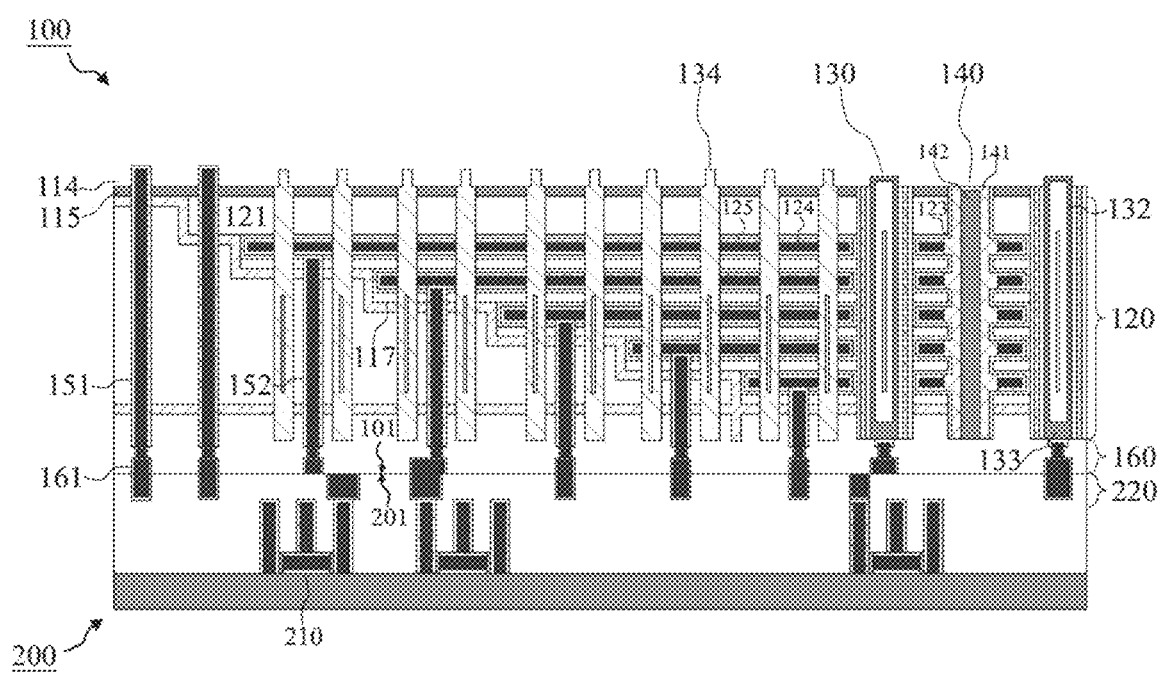

Step S150 will be described with the protective layer 171-1 covering the exposed portion of the dummy channel structure 134 (see FIG. 8A) taken as an example. In some implementations, as shown in FIG. 9A, the charge barrier layer 1311 and the charge trapping layer 1312 in the exposed portion of the channel structure 130 may be removed sequentially using a dry or wet etching process to expose the tunneling layer 1313. In some implementations, as shown in FIG. 10, when the material of the protective layer 171-1 is photoresist, it may be removed using a wet chemical process or a dry plasma process under heating. After the protective layer 171-1 is removed, the dummy channel structures 134 are exposed again. In some implementations, during the process of removing the protective layer 171-1, the conductive contacts 151 are also exposed again. In this step, as shown in FIG. 11, the tunneling layer 1313 in the exposed portion of the channel structure 130 may be removed using a dry or wet etching process to expose the channel layer 132. In some implementations, during the process of removing the tunneling layer 132, the silicon oxide layer 114 between the protective layer 171-1 and the stack structure 120 may also be removed. In some implementations, when the polysilicon layer 115 is included, it can function a stop layer of the process of removing the functional layer 131 (e.g., the tunneling layer 1313), facilitating the control of process uniformity for the removing of the functional layer 131 (e.g., the tunneling layer 1313).

In accordance with the implementations of the present application, the protective layer 171-1 is removed after removing the charge barrier layer 1311 and the charge trapping layer 1312 in the exposed portion of the channel structure 130, so that the tunneling layers 1313 in the exposed portion of the channel structure 130 can cover the surface of at least portion of the channel layer 132, lowering the probability of surface oxidization of the channel layer 132. In some implementations, in this case, there is no need to add the step of removing the surface oxide layer of the channel layer 132, for example, by diluted hydrofluoric acid solution in the fabrication process, simplifying the fabrication process. In some implementations, during the process of removing at least the portion of the functional layer 131 in the exposed portion of the channel structure 130 (e.g., the charge barrier layer 1311 and the charge trapping layer 1312 in the exposed portion of the channel structure 130), a part of the second portion of the insulating layer 141 (i.e., the portion of the insulating layer 141 away from the second semiconductor structure 200) in the gate line slit structure 140 may be removed (see FIG. 9A). In some implementations, when the second portion of the insulating layer 141 is relatively thick, after the part of the second portion of the insulating layer 141 is removed, the remaining part of the second portion of the insulating layer 141 can still cover the side of the conductive layer 142 away from the second semiconductor structure 200, which helps to prohibit the tendency to enlarge the seams or voids in the gate line slit structure 140 by the etching materials (e.g., etching gases) during the process of removing the tunneling layers 1313 and in turn lower the risk of short circuit leakage between gate conductive layers (e.g., between adjacent gate conductive layers) that may occur during the subsequent process of forming semiconductor layers because of the semiconductor materials that could be filled into the seams or voids. In some implementations, when the second portion of the insulating layer 141 is relatively thin, after a part of the second portion of the insulating layer 141 is removed, the end face of the conductive layer 142 in the gate line slit structure 140 may be exposed (see FIG. 9B).

In some other implementations, the protective layer 171-1 may be removed after the charge barrier layer 1311, the charge trapping layer 1312 and the tunneling layer 1313 of the functional layer 131 in the exposed portion of the channel structure 130 have been removed. In some implementations, the charge barrier layer 1311, the charge trapping layer 1312 and the tunneling layer 1313 in the exposed portion of the channel structure 130 may be removed (e.g., sequentially) using dry or wet etching process to expose the channel layer 132. In some implementations, when the material of the protective layer 171-1 is photoresist, it may be removed using, for example, the wet chemical process or the dry plasma process under heating. After the protective layer 171-1 is removed, the dummy channel structure 134 is exposed again. In some implementations, during the process of removing the protective layer 171-1, the conductive contacts 151 are also exposed again. In accordance with the implementation of the present application, the protective layer 171-1 is removed after removing the functional layer 131 in the exposed portion of the channel structure 130, so that the risk of enlarging the seams or voids in the gate line slit structure 140 by the etching materials (e.g., etching gases) during the process of removing the tunneling layers 1313 can be further lowered, which in turn helps to lower the risk of short circuit leakage between gate conductive layers (e.g., adjacent gate conductive layers) that may occur during the subsequent process of forming semiconductor layers because of the semiconductor materials that could be filled into the seams or voids.

Figure 12:
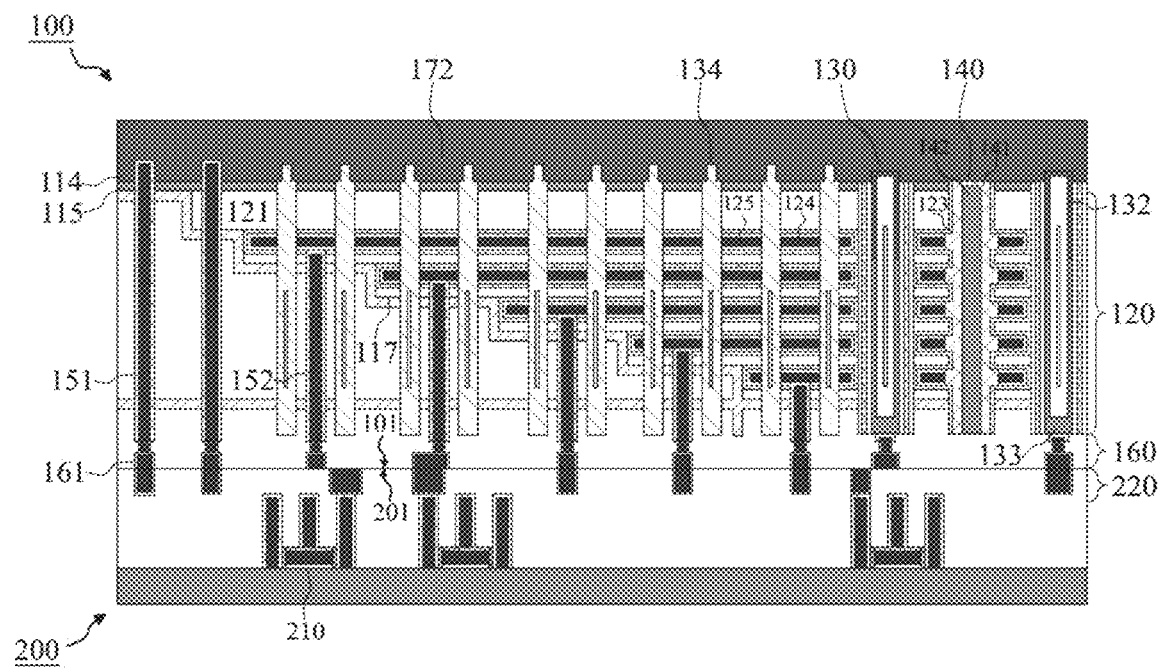

In some implementations, as shown in FIG. 12, a semiconductor layer 172 may be formed in contact with the channel layer 132 using a thin film deposition process such as CVD, PVD, ALD or any combination thereof. In some implementations, the semiconductor layer 172 may cover the exposed portion of the channel structures 130, for example, enclose the exposed portion of the channel structure 130. In some implementations, during the process of forming the semiconductor layer 172, the semiconductor layer 172 may cover (e.g., enclose) the exposed portions of the dummy channel structure 134, gate line slit structure 140 and conductive contacts 151. In some implementations, the material of the semiconductor layer 172 may include, for example, polysilicon, and the process of forming the semiconductor layer 172 may include, but not limited to, forming a layer of amorphous silicon on the first side of the stack structure 120 using a thin film deposition process such as CVD, PVD, ALD or any combination thereof. Further, the amorphous silicon is converted into polysilicon by, for example, laser annealing to form the semiconductor layer 172. By using the above-mentioned method, the influence on the bonding interface between the first semiconductor structure 100 and the second semiconductor structure 200 during the process of forming the semiconductor layer 172 may be reduced. In some implementations, the surface of the deposited semiconductor layer 172 may be planarized by, for example, a CMP process. It is to be understood that the semiconductor layer 172 is in contact and thereby in electrical connection with the channel layer 132, so that the channel layer 132 in the channel structure 130 is electrically connected with the semiconductor layer 172. In some implementations, the channel layers 132 of a plurality of channel structures 130 may be electrically connected with the semiconductor layer 172.

Figure 13:
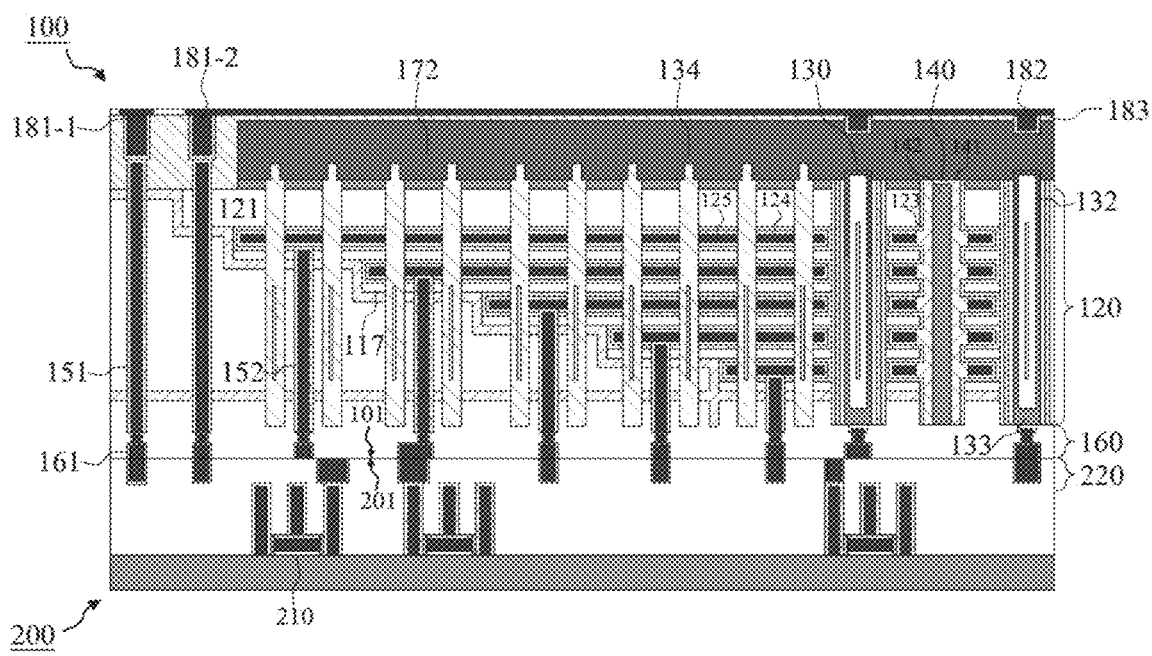

In some implementations, a doped region may be formed in the portion of the channel layer 132 proximate to the semiconductor layer 172 using, for example, an ion implantation process and a laser annealing process. For example, in the direction approximately perpendicular to the semiconductor layer 172, the height of the doped region may be above the height of at least one gate conductive layer 125. In some implementations, the doped region of the channel layer 132 and the corresponding functional layer 131 may be used to form a bottom select transistor, and the bottom selection transistor can have different threshold voltage values by adjusting the doping concentration of the doping region. In some implementations, as shown in FIG. 13, after the above-described process treatments, an insulating material layer 183 may be formed on the semiconductor layer 172 using a thin film deposition process such as CVD, PVD, ALD or any combination thereof. In some implementations, the portions of the insulating material layer 183 and the semiconductor layer 172 corresponding to the conductive contacts 151 may be removed, for example, by the photolithography and etching processes (e.g., a dry or wet etching process) to form an opening exposing the conductive contacts 151, and the insulating material layer 183 is refilled into the opening. In some implementations, first contacts (such as first contacts 181-1 and 181-2) in contact with the conductive contacts 151 and second contacts (such as second contacts 182) in contact with the semiconductor layer 172 may be formed by the photolithography and etching processes (e.g., the dry or wet etching process) and the thin film deposition process. In some implementations, the first contacts (such as the first contacts 181-1 and 181-2) may be used to transfer signals to and from external circuits (not shown), and the second contacts (such as the second contacts 182) may be structure used for electrical connection with the semiconductor layer 172. In some implementations, the material of the insulating material layer 183 may include, but not limited to, silicon oxide, silicon nitride, silicon oxynitride or any other suitable low dielectric constant material. The materials of the first contacts 181 and the second contacts 182 may include conductive material such as tungsten, cobalt, copper, aluminum or any combination thereof.

In accordance with the method of fabricating a three-dimensional memory device provided in the implementations of the present application, by forming a protective layer covering one of the dummy channel structure and the gate line slit structure after removing the substrate, the tendency to enlarge the seams or voids in the dummy channel structure and/or the gate line slit structure (or on both sides of it) by etching materials during the process of removing at least portion of the functional layer can be prohibited, so as to lower the risk of short circuit leakage among gate conductive layers which may occur during the process of forming semiconductor layers because of the semiconductor materials that could be filled into the seams or voids, so that the reliability of electrical connection of the fabricated three-dimensional memory device can be improved.

The description above is only for the purpose of explaining preferred implementations and the used technical principles of the present application. It will be appreciated by those skilled in the art that the scope claimed by the present application is not limited to technical solutions composed of particular combinations of the above-mentioned technical features, and instead will cover any other technical solutions composed of any combinations of the above-mentioned features and their equivalents without departing from the concept of the disclosure. For example, technical solutions resulted from substitutions of the above-mentioned features by technical features with (but not limited to) similar functions disclosed in the present application still fall within the scope of the present disclosure.

The breadth and scope of the present disclosure should not be limited by any of the above-described exemplary implementations, but should be defined only in accordance with the following claims and their equivalents.

What is claimed is:

1. A method of fabricating a three-dimensional (3D) memory device, comprising:
    forming a stack structure on a substrate;
    forming a channel structure, a dummy channel structure, and a gate line slit structure penetrating through the stack structure and extending into the substrate;
    removing the substrate to expose a first side of the stack structure;
    forming a protective layer covering an exposed portion of the dummy channel structure on the first side of the stack structure;
    removing at least a portion of an exposed portion of the channel structure; and
    removing the protective layer after removing at least the portion of the exposed portion of the channel structure,
    wherein an etch rate of removing the protective layer is lower than that of removing the portion of the exposed portion of the channel structure.

2. The method of claim 1, wherein the channel structure comprises a channel layer and a functional layer; and removing at least the portion of the exposed portion of the channel structure comprises removing at least an exposed portion of the functional layer in at least the portion of the exposed portion of the channel structure.

3. The method of claim 1, wherein before removing at least the portion of the exposed portion of the channel structure, the protective layer covers the gate line slit structure.

4. The method of claim 1, wherein removing at least the portion of the exposed portion of the channel structure uses the protective layer as an etch block layer.

5. The method of claim 1, wherein
    the gate line slit structure comprises a conductive layer and an insulating layer;
    a first portion of the insulating layer covers a side wall of the conductive layer;
    a second portion of the insulating layer is formed between the conductive layer and the substrate; and the method further comprises removing a part of the second portion of the insulating layer in a same process of removing at least the portion of the exposed portion of the channel structure.

6. The method of claim 1, wherein
the gate line slit structure comprises a conductive layer and an insulating layer;
a first portion of the insulating layer covers a side wall of the conductive layer;
a second portion of the insulating layer is formed between the conductive layer and the substrate; and
removing at least the portion of the exposed portion of the channel structure comprises removing the second portion of the insulating layer in a same process of removing at least the portion of the exposed portion of the channel structure.

7. The method of claim 1, wherein forming the channel structure, the dummy channel structure and the gate line slit structure penetrating through the stack structure and extending into the substrate further comprises forming a high dielectric constant layer at least partially covering a sidewall of the gate line slit structure.

8. The method of claim 2, wherein
the functional layer comprises a charge barrier layer, a charge trapping layer, and a tunneling layer; and
the method further comprises removing the protective layer after the charge barrier layer and the charge trapping layer in the exposed portion of the functional layer being removed.

9. The method of claim 8, further comprising removing the tunneling layer in the exposed portion of the channel structure to expose the channel layer after the protective layer being removed.

10. The method of claim 2, wherein
the functional layer comprises a charge barrier layer, a charge trapping layer, and a tunneling layer; and
the method further comprises removing the protective layer after removing the charge barrier layer, the charge trapping layer, and the tunneling layer in the exposed portion of the channel structure to expose the channel layer.

11. The method of claim 10, further comprising forming a semiconductor layer in contact with an exposed portion of the channel layer on the first side.

12. The method of claim 11, further comprising: forming a doped region in the exposed portion of the channel layer that is proximate to the semiconductor layer using an ion implantation process and a laser annealing process.

13. The method of claim 1, wherein the protective layer comprises a photoresist layer.

14. The method of claim 1, further comprising forming a second semiconductor structure on a second side of the stack structure before removing the substrate to expose the first side of the stack structure.

15. The method of claim 14, wherein the second semiconductor structure comprises at least a peripheral device comprising metal oxide semiconductor field effect transistor (MOSFET), bipolar transistor (BJT), diode, resistor, inductors, capacitor, or any combinations thereof.

16. The method of claim 14, further comprising forming an interconnect layer coupled between the second semiconductor structure and a word line contact, wherein the word line contact is in contact with a gate conductive layer.

17. The method of claim 1, wherein forming the stack structure comprises:
forming alternating gate sacrificial layers and dielectric layers; and
after forming the gate line slit structure, replacing the gate sacrificial layers with gate conductive layers.

* * * * *